United States Patent
Suzuki (10) Patent No.: US 6,822,464 B2
(45) Date of Patent: Nov. 23, 2004

(54) PROBE CARD TRANSPORTING APPARATUS AND TO-BE-CONNECTED BODY MOVING MECHANISM

(75) Inventor: Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/787,179

(22) Filed: Feb. 27, 2004

(65) Prior Publication Data

US 2004/0164756 A1 Aug. 26, 2004

Related U.S. Application Data

(63) Continuation of application No. PCT/JP03/05531, filed on Apr. 30, 2003.

(30) Foreign Application Priority Data

May 29, 2002 (JP) ........................................ 2002-155175

(51) Int. Cl.[7] .............................................. G01R 31/02
(52) U.S. Cl. ...................................... 324/754; 324/758
(58) Field of Search ................................. 324/754, 758, 324/765, 158.1, 72.5; 414/788–795.2; 439/484

(56) References Cited

U.S. PATENT DOCUMENTS

| | | | | |
|---|---|---|---|---|
| 4,103,232 A | * | 7/1978 | Sugita et al. ................ | 324/754 |
| 5,290,134 A | * | 3/1994 | Baba ........................... | 414/404 |
| 5,307,011 A | * | 4/1994 | Tani ........................ | 324/158.1 |
| 5,313,156 A | * | 5/1994 | Klug et al. ............... | 324/158.1 |
| 5,444,386 A | * | 8/1995 | Mizumura ................... | 324/754 |
| 5,812,409 A | * | 9/1998 | Kanno et al. ............... | 700/213 |
| 6,034,524 A | * | 3/2000 | Barringer et al. ......... | 324/158.1 |
| 6,107,813 A | * | 8/2000 | Sinsheimer et al. ........ | 324/758 |
| 6,163,145 A | * | 12/2000 | Yamada et al. ........... | 324/158.1 |
| 6,414,478 B1 | | 7/2002 | Suzuki | |

FOREIGN PATENT DOCUMENTS

| | | |
|---|---|---|
| JP | 1-264235 | 10/1989 |
| JP | 05-337780 | 12/1993 |
| JP | 2001-24039 | 1/2001 |

* cited by examiner

*Primary Examiner*—David Zarneke
*Assistant Examiner*—Jermele Hollington
(74) *Attorney, Agent, or Firm*—Oblon, Spivak, McClelland, Maier & Neustadt, P.C.

(57) ABSTRACT

A probe card transporting apparatus includes a moving mechanism to transport a probe card with a card holder to a clamp mechanism in a prober chamber. When mounting and demounting the probe card with the card holder through a first positioning pin, this moving mechanism uses a support which mounts the probe card with the card holder. The support fits a second positioning pin supported by a swingable supporting means in a second opening formed in the card holder. A second positioning pin has a spherical top.

12 Claims, 4 Drawing Sheets

PROBE CARD TRANSPORTING APPARATUS AND TO-BE-CONNECTED BODY MOVING MECHANISM

CROSS-REFERENCE TO RELATED APPLICATIONS

This is a Continuation Application of PCT Application No. PCT/JP03/05531, filed Apr. 30, 2003, which was not published under PCT Article 21(2) in English.

This application is based upon and claims the benefit of priority from the prior Japanese Patent Application No. 2002-155175, filed May 29, 2002, the entire contents of which are incorporated herein by reference.

BACKGROUND OF THE INVENTION

1. Field of the Invention

The present invention relates to a probe card transporting apparatus and a carrying mechanism for carrying a to-be-connected body to a predetermined position of a connecting body. More specifically, the present invention relates to a probe card transporting apparatus for smoothly arranging a probe card at a first predetermined position in a prober chamber, and a to-be-connected body carrying mechanism which can be suitably used by the probe card transporting apparatus.

2. Description of the Related Art

A probe card transporting apparatus can be used when loading a probe card in and unloading it from a prober.

An example of a conventional probe card transporting apparatus is shown in FIG. 1 of Jpn. Pat. Appln. KOKAI Publication No. 2001-24039 filed by the present applicant. A prober shown in FIG. 7A will be described. A stage (wafer chuck) 2 for placing a wafer thereon, a clamp mechanism 4, and a probe card 6 are arranged in a prober chamber 1. The stage 2 can move in X, Y, Z, and θ directions. The clamp mechanism 4 is fixed in a substantially central hole 3A of a head plate 3 arranged above the wafer chuck 2. The probe card 6 is detachably held by the clamp mechanism 4 through a card holder 5. A loader chamber (not shown) is arranged adjacent to the prober chamber 1. A wafer transported from the loader chamber is placed on the wafer chuck 2 in the prober chamber 1. An alignment mechanism (not shown) moves the wafer chuck 2 in the X, Y, Z, and θ directions. Thus, the wafer placed on the wafer chuck and probes 6A of the probe card 6 are aligned. After that, the electrical characteristics of circuits formed on the wafer are tested.

Figures 7A, 7B:
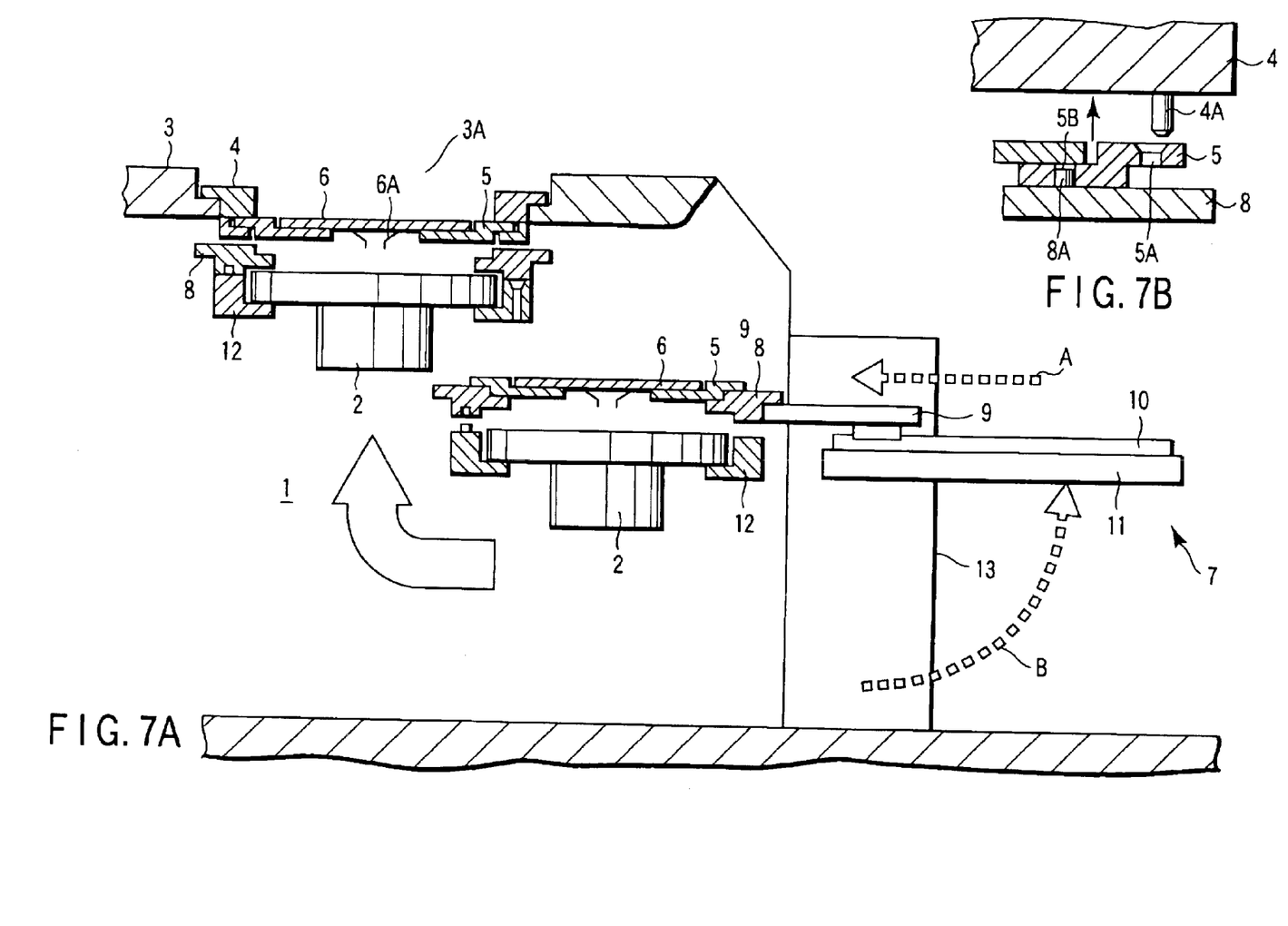
FIG. 7A is a view showing the outline of the apparatus.
FIG. 7B is a view showing a state wherein the position of a positioning pin and the position of a positioning opening are shifted from each other.

As shown in FIG. 7A, the probe card transporting apparatus has the wafer chuck 2 which is movable in the X, Y, Z, and θ directions in the prober chamber 1, and a transfer mechanism 7 which transfers and receives the probe card 6 with the card holder 5 to and from the wafer chuck 2.

As shown in FIG. 7A, the transfer mechanism 7 has an adapter 8 for detachably holding the probe card 6 with the card holder 5, a fork-like arm 9 having a top branching in two directions to detachably hold the adapter 8, a pair of guide rails 10 for moving and guiding the arm 9 in a direction of arrow A, and a moving mechanism 11 for fixing the guide rails 10. The arm 9 of the transfer mechanism 7 transfers the adapter 8 holding the probe card 6 between an adapter support 12 fixed to the wafer chuck 2 and the outside of the prober chamber.

A mechanism (the clamp mechanism 4, card holder 5, and adapter 8) for mounting and demounting the probe card 6 will be described with reference to FIG. 7B. First positioning pins (for example, 2) 4A are fixed to the clamp mechanism 4. The card holder 5 has first holes 5A to fit with the first positioning pins 4A. The adapter 8 has (e.g., 2) second positioning pins 8A. The card holder 5 has second holes 5B to fit with the second positioning pins 8A. The card transporting apparatus transports the probe card 6 to immediately under the clamp mechanism 4. After that, the wafer chuck 2 moves upward. The first positioning pins 4A fit in the first holes 5A, so that the card holder 5 comes into contact with the clamp mechanism 4. The clamp mechanism 4 fixes the probe card 6 to the head plate 3. In FIG. 7A, a member 13 denotes a storage unit for storing the transfer mechanism 7 folded in a direction opposite to arrow B.

Because of an alignment error between the probe card 6 and clamp mechanism 4 in FIG. 7A and the thermal expansion or aging of the respective mechanical elements, a positioning error can occur between the first positioning pins 4A of the clamp mechanism 4 and the first holes 5A of the card holder 5, as shown in FIG. 7B. With the first positioning pins 4A and first holes 5A being shifted from each other, when the wafer chuck 2 moves up, the probe card 6 is urged against the clamp mechanism 4, and an excessive stress is produced between the first holes 5A of the card holder 5 and the first positioning pins 4A of the clamp mechanism 4. In an extreme case, this stress may damage the clamp mechanism 4, probe card 6, or the like. This problem arises also when a connecting body and a to-be-connected body are to be pin-connected to each other using an adapter.

BRIEF SUMMARY OF THE INVENTION

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

It is an object of the present invention according to a first aspect to provide a probe card transporting apparatus which solves at least one of the problem of smoothly connecting a support (e.g., a card holder) that supports a probe card and a clamp mechanism, the problem of reliably connecting the support and the clamp mechanism to each other, and the problem of reducing excessive stress produced when connecting the support and clamp mechanism to each other, even when the position of the support and the attaching position of the clamp mechanism are shifted from each other.

It is an object of the present invention according to a second aspect to solve at least one of the problem of smoothly connecting a to-be-connected body and a connecting body, the problem of reliably connecting the to-be-connected body and the connecting body, and the problem of reducing excessive stress produced when connecting the to-be-connected body and connecting body to each other.

According to the first aspect of the invention of the present application, there is provided a probe card transporting apparatus configured to transport a probe card with a card holder between a first predetermined position set in a prober chamber and a second predetermined position L3 set outside the prober chamber.

The probe card transporting apparatus preferably comprises the following (a) and furthermore the following (b):
(a) a first positioning fitting tool arranged at the first predetermined position in the prober chamber;
 a transfer mechanism configured to carry the probe card with the card holder between a transfer position set in the prober chamber and the second predetermined position outside the prober chamber and to transfer the probe card with the card holder at the respective predetermined positions, the card holder including a first positioning to-be-fitted tool and a second positioning to-be-fitted tool; and a support carrying mechanism configured to carry the probe card with the card holder between the transfer position in the prober chamber and the first predetermined position in the prober chamber, the support carrying mechanism including: a support configured to place thereon and support the probe card with the card holder; a second positioning fitting tool attached to the support through a swingable support mechanism; and a support moving mechanism configured to move the support in X, Y, Z, and θ directions, the support moving mechanism serving to carry the probe card with the card holder between the transfer position and the first predetermined position in the prober chamber, wherein the probe card with the card holder which is carried by the support moving mechanism is positioned at the first predetermined position in the probe chamber when the first positioning to-be-fitted tool of the probe card with the card holder fits with the first positioning fitting tool.

(b) The first positioning fitting tool and the second positioning fitting tool comprise a first positioning pin and a second positioning pin, respectively; the first positioning to-be-fitted tool and the second positioning to-be-fitted tool comprise a first opening and a second opening, respectively; a top of the second positioning pin is substantially spherical at least partly; and the second positioning pin is attached to the support through a swingable support mechanism.

According to the second aspect of the invention of the present application, there is provided a to-be-connected body carrying mechanism configured to carry a to-be-connected body to a predetermined position set on a connecting body.

The to-be-connected body carrying mechanism preferably comprises the following (c), and furthermore the following (d).

(c) A positioning to-be-fitted tool provided to the to-be-connected body;

a support configured to place thereon and hold the to-be-connected body;

a positioning fitting tool 542 attached to the support through a swingable support mechanism, the positioning fitting tool serving to fit with the positioning to-be-fitted tool of the to-be-connected body, so that the to-be-connected body is positioned on the support; and a support moving mechanism configured to move the support in X, Y, Z, and θ directions.

(d) The positioning fitting tool comprises a positioning pin; a top of the positioning pin is substantially spherical at least partly; and the positioning to-be-fitted tool comprises an opening.

Each of the probe card transporting apparatus according to the first aspect of the invention of the present application and the to-be-connected body moving mechanism according to the second aspect of the invention of the present application preferably comprises one or a plurality of the following (e) to (h).

(e) The swingable support mechanism comprises a leaf spring 543A.

(f) The swingable support mechanism further comprises means for limiting a tilting angle of the second positioning pin.

(g) The leaf spring of the swingable support mechanism comprises a plurality of slits.

(h) The plurality of slits comprise a plurality of arcuate slits arranged substantially concentrically and having different diameters.

BRIEF DESCRIPTION OF THE SEVERAL VIEWS OF THE DRAWING

FIGS. 6A and 6B are views showing the operation of the probe card transporting apparatus shown in FIG. 1 to mount a probe card on a clamp mechanism, in which FIGS. 7A and 7B are schematic views showing an example of a conventional probe card transporting apparatus, in which

DETAILED DESCRIPTION OF THE INVENTION

The accompanying drawings, which are incorporated in and constitute a part of the specification, illustrate presently preferred embodiments of the invention and, together with the general description given above and the detailed description of the preferred embodiments given below, serve to explain the principles of the invention.

An embodiment of the present invention shown in FIGS. 1 to 6B will be described.

A probe card to be transported by a probe card transporting apparatus of the present invention includes a probe card for testing the electrical characteristics of integrated circuits formed on a semiconductor wafer, and other probe cards in a wide field for testing the electrical characteristics of electrical circuit products (e.g., a liquid crystal display). A to-be-connected body carrying mechanism according to the present invention is aimed at a to-be-connected body in a wider field. For the purpose of explaining the invention of the present application more practically, in the following description, the invention of the present application will be explained by way of a probe card for testing the electrical characteristics of integrated circuits formed on a semiconductor wafer. Accordingly, the target of the present invention is not limited to the probe card to be described below.

Figure 1:
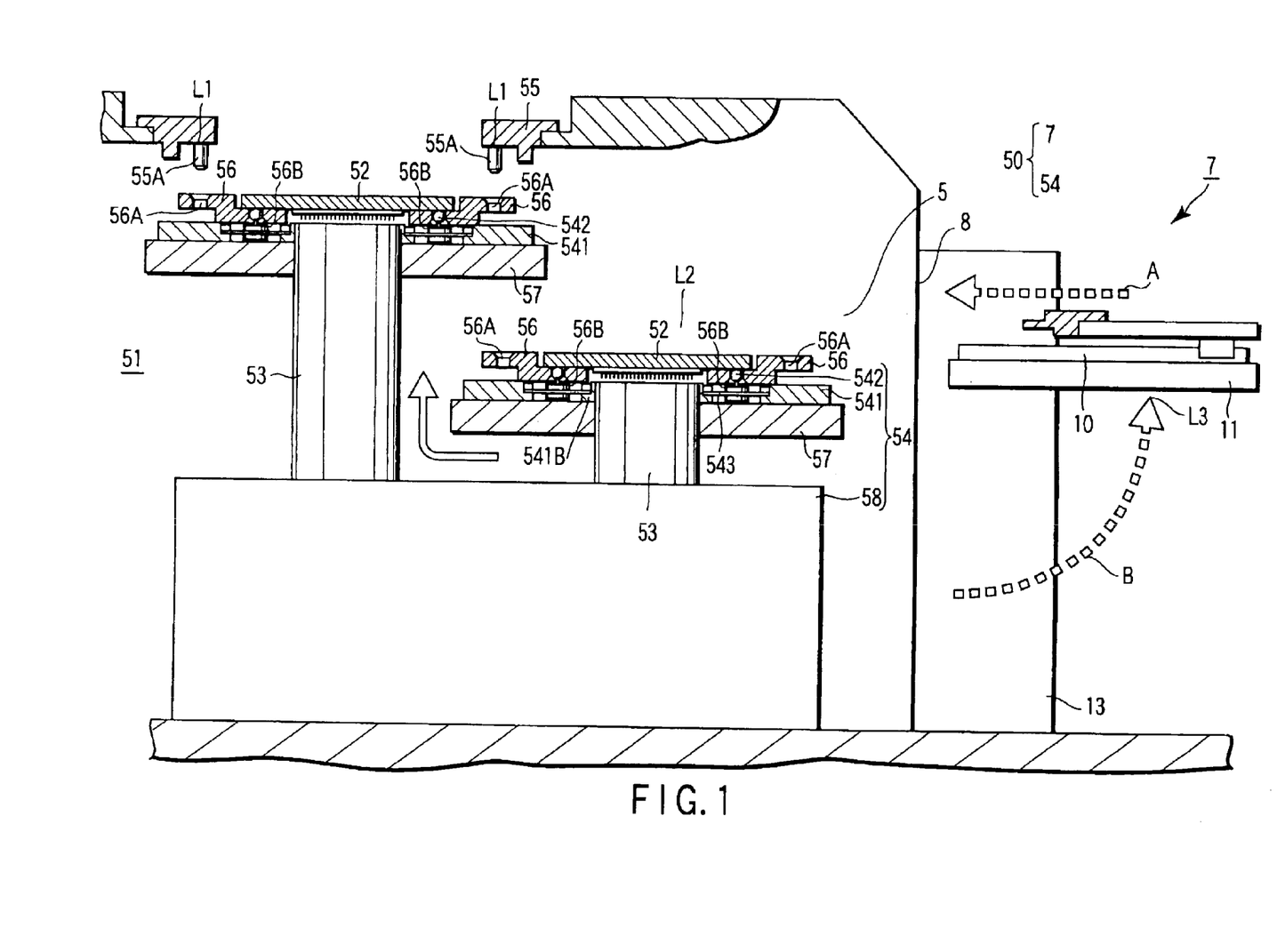
FIG. 1 is a view showing the main part of a probe card transporting apparatus according to an embodiment of the present invention.

As shown in FIG. 1, a probe card transporting unit 50 of this embodiment may comprise a transfer mechanism 7 for carrying a probe card 52 with a card holder 56 (to be referred to as a "probe card" hereinafter) between a second predetermined position L3 outside a prober chamber 51 and a transfer position L2 in the prober chamber, and a support carrying mechanism 54 for carrying the probe card 52 between a support 541 arranged at the transfer position L2 and a clamp mechanism 55 arranged at a first predetermined position L1 in the prober chamber. The support 541 can employ any mechanism as far as it is a mechanism configured to place thereon and hold the probe card received from the transfer mechanism 7.

The transfer mechanism 7 can employ any mechanism as far as it is a mechanism that can carry the probe card 52 from the second predetermined position L3 outside the prober chamber 51 to the transfer position L2 in the prober chamber. As the transfer mechanism 7, for example, a transfer mechanism 7 having an arm 9 shown in FIG. 7A can be employed. Alternatively, a transfer mechanism having a vacuum chucking system, or a mechanism that executer a transfer step with a manual operation partly or entirely can be employed.

An embodiment of the support carrying mechanism 54 will be described. The support carrying mechanism 54 can be arranged in the prober chamber 51 of the prober. The embodiment of the support carrying mechanism 54 may include the support 541, a support table 57, and a support moving mechanism 58. The support moving mechanism 58 is configured to move the support 541 in the X, Y, Z, and θ directions between the clamp mechanism 55 and the position L2 where the probe card is transferred from the transfer mechanism 7.

The support table 57 to which the support 541 is attached can be added to a stage (e.g., wafer chuck) 53. The support 541 and support table 57 can be formed integrally. The support moving mechanism 58 moves the stage 53 in the X, Y, Z, and θ directions, so that the support table 57 and the support 541 added to the stage 53 are moved in the X, Y, Z, and θ directions. With this movement, the probe card 52 can also be carried in the same direction.

The transfer mechanism 7 cooperates with the support carrying mechanism 54 to carry the probe card 52 with the card holder 56 between the predetermined position L3 outside the prober chamber and the support 541 arranged at the transfer position L2 in the prober chamber. As the support moving mechanism 58 moves the stage 53, the support 541 added to the stage 53 and the probe card 52 mounted on the support 541 are moved toward the clamp mechanism 55, so that the probe card 52 comes into contact with the clamp mechanism 55. In this contact, first positioning fitting tools (e.g., first positioning pins) 55A of the clamp mechanism 55 fit with first positioning to-be-fitted tools (e.g., first openings) 56A of the card holder 56.

Although not shown, as is disclosed in Jpn. Pat. Appln. KOKAI Publication No. 2001-24039, the support carrying mechanism 54 of this embodiment may include a mechanism for vacuum-chucking the support 541 and card holder 56, and a mechanism for vacuum-chucking the support 541 and the support table 57 added to the stage 53.

As shown in FIG. 1, the support carrying mechanism 54 according to this embodiment may include the support 541 having a central hole 541B to fit with the stage 53, and the support moving mechanism 58. The support 541 has second positioning fitting tools 542. The second positioning fitting tools 542 are preferably arranged at two positions separated from each other by 180° in the circumferential direction of the support 541. As the embodiment of the second positioning fitting tool 542, second positioning pins can be employed. The second positioning pins 542 fit with second positioning to-be-fitted tools (e.g., second openings) 56B of the card holder 56.

Figure 2:
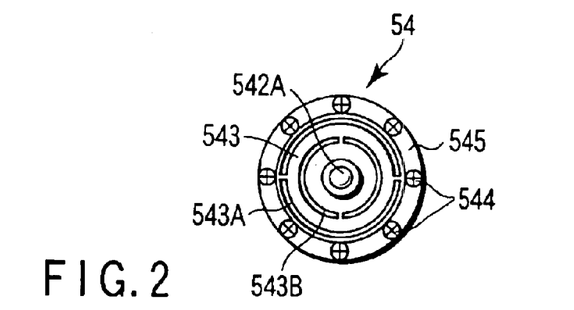
FIG. 2 is a plan view of a swingable support of the probe card transporting apparatus of the present invention.
Figure 3:
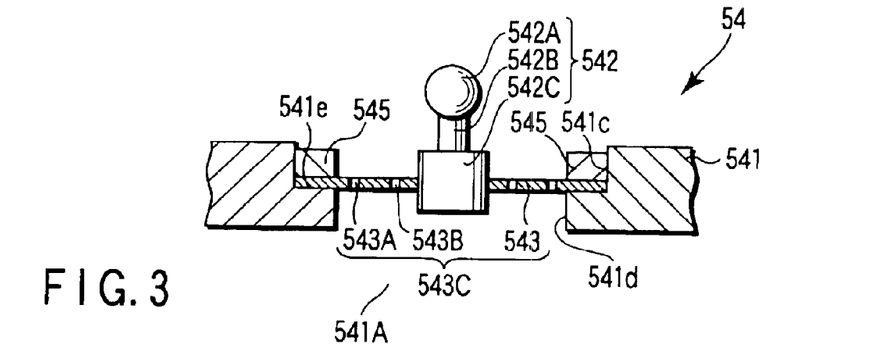
FIG. 3 is a view showing the swingable support and a second positioning pin of the probe card transporting apparatus of the present invention.

As shown in FIGS. 1 to 3, the embodiment of the second positioning pin 542 can have a spherical top 542A. This top suffices as far as its partial surface that comes into contact with the inner surface of the second opening practically forms a spherical surface. Furthermore, the second positioning pin 542 can have a shaft 542B extending downward from the top 542A and, if necessary, a support 542C which supports the shaft 542B.

The second positioning pin 542 can be attached by a support mechanism 543C (see FIG. 3) swingable around a second opening 541A (see FIG. 3) of the support 541. As the swingable support mechanism, any mechanism that can swingably support the positioning pin can be employed. As an embodiment of the swingable support mechanism 543C, a leaf spring 543 can be employed. The opening 541A of the support 541 is preferably formed of an upper large-diameter portion 541C, a lower small-diameter portion 541d, and a horizontal stepped portion 541e located at the boundary of the large- and small-diameter portions, as shown in enlargement in FIG. 3. The leaf spring 543 can be mounted on the stepped portion 541e. The leaf spring 543 can be fixed to the stepped portion 541e with a plurality of screws 544 and a retaining ring 545, as in the embodiment shown in FIGS. 2 and 3. The support 542C of the second positioning pin 542 can be fixed to the leaf spring 543 as it extends through the central portion of the leaf spring 543. The leaf spring 543 can have a plurality of (e.g., 2) arcuate slits 543A and 543B arranged concentrically and having different diameters, as shown in FIG. 2. The arcuate slits 543A and 543B are preferably arranged at positions shifted from each other by 90°. With this arrangement, the second positioning pin 542 is attached to be swingable in all directions. The number, length, width, positional relationship, and the like of the arcuate slits 543A and 543B can be appropriately set in accordance with the necessary strength, the degree of swing, and the like. The leaf spring 543 having the arcuate slits 543A and 543B can be employed as a suitable example of the support mechanism through which the second positioning pin 542 is swingably attached to the support.

Figure 4:
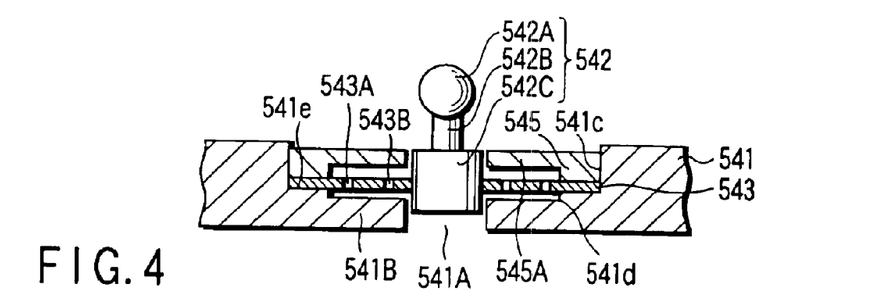
FIG. 4 is a sectional view showing another embodiment concerning the swingable support that can be used in the probe card transporting apparatus of the present invention.
Figure 5:
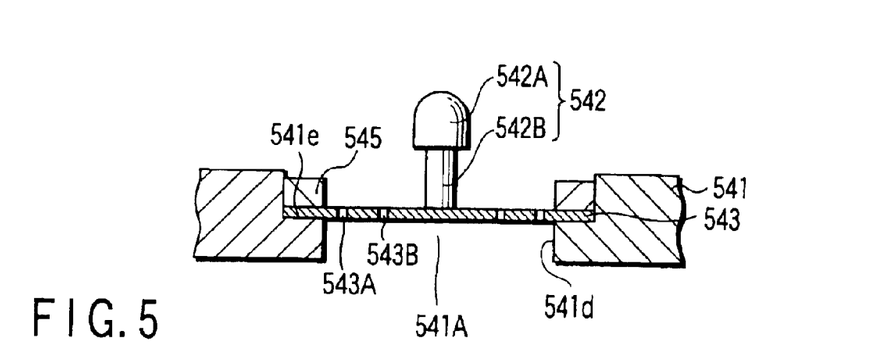
FIG. 5 is a sectional view showing still another embodiment concerning the swingable support that can be used in the probe card transporting apparatus of the present invention.

FIGS. 4 and 5 show other embodiments of the second positioning fitting tool 542 of the present invention. A second positioning fitting tool 542 shown in FIG. 4 or 5 can be employed in place of the second positioning fitting tool 542 shown in FIG. 1. Then, probe card transporting apparatuses 50 as other embodiments of the present invention can be formed.

The fitting tools of this embodiment will be described with reference to FIGS. 4 and 5 by denoting portions that are the same as or equivalent to those in the embodiment shown in FIGS. 2 and 3 by the same reference numerals.

As a means 545A for limiting the tilting angle of the second positioning pin 542, any mechanism that limits the tilting angle of the second positioning pin 542 can be employed. The second positioning fitting tool 542 shown in FIG. 4 can have either a flange 541B or a reduced-diameter portion 545A of a retaining ring 545. The means 545A can further have both the flange 541B and the reduced-diameter portion 545A. The means 545A can be arranged in the opening 541A of the support 541. The second positioning pin 542 and leaf spring 543 can be formed in the same manner as in the above embodiment, but the opening 541A and retaining ring 545 are partly different from those of the above embodiment. As shown in FIG. 4, the small-diameter portion 541d of the opening 541A has a flange 541B with a smaller diameter. The inner diameter of the flange 541B is slightly larger than the outer diameter of the support 542C of the second positioning pin 542. The retaining ring 545 has the thick flange-like reduced-diameter portion 545A. The inner diameter of the reduced-diameter portion 545A is slightly larger than that of the support 542C of the second positioning pin 542. The flange 541B of the opening 541A and the reduced-diameter portion 545A of the retaining ring 545 can have substantially the same inner diameters. Two or either one of the flange 541B and reduced-diameter portion 545A can limit the tilting angle of the second positioning pin 542.

Since the tilting angle of the second positioning pin 542 is limited, plastic deformation of the leaf spring 543 can be prevented. As a result, the durability of the leaf spring is increased. In this embodiment, at least the flange 541B or reduced-diameter portion 545A is employed as a means for limiting tilt. Any means that can limit the tilting angle of the second positioning pin can be employed.

FIG. 5 shows another embodiment of the second positioning pin 542. The second positioning pin 542 of this embodiment is different from that of the embodiment shown in FIG. 1 in that its support is omitted. This embodiment has a top 542A and shaft 542B. The top 542A has a semispherical structure in which only its upper portion is spherical. As the structure of the top 542A of any of the second positioning pins 542 shown in FIGS. 3, 4, and 5, either a spherical structure, a semispherical structure, or a partly spherical structure can be employed.

Figure 6A:
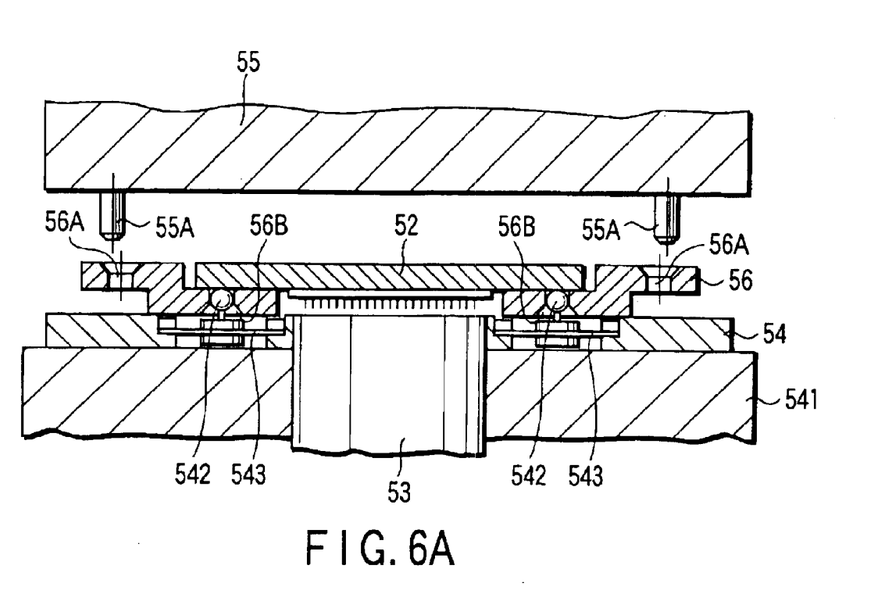
FIG. 6A is a sectional view showing a state immediately before the card holder of the probe card and the clamp mechanism are connected to each other.

The operation of the probe card transporting apparatus shown in FIG. 1 will be described with reference to FIGS. 1, 6A, and 6B.

(a) The transfer mechanism 7 carries the probe card 52 from the second predetermined position L3 outside the prober chamber 51 to the transfer position L2 in the prober chamber (see FIG. 1)

(b) The support moving mechanism 58 positions the stage 53 below the transfer position L2. The support moving mechanism 58 moves the stage 53 upward through the Y-shaped portion of the support (e.g., fork) of the transfer mechanism 7.

(c) The support 541 appended to the stage 53 receives the probe card 52 from the transfer mechanism 7. At this time, the support 541 is preferably fixed on the support table 57. As a means for fixing, a mechanical attaching mechanism or an attaching mechanism utilizing a vacuum chucking force can be employed. After transferring the probe card 52 to the support 541, the transfer mechanism 7 moves outside the prober chamber 51.

(d) After receiving the probe card 52, the stage 53 moves to a position under the clamp mechanism 55 then moves upward. As shown in FIGS. 1 and 6B, the stage 53 moves upward to come close to the clamp mechanism 55. The positioning error of the stage 53, the dimensional errors of the support 541 and clamp mechanism 55 due to aging and the like sometimes can cause a shift between axes of the first positioning pins 55A of the clamp mechanism 55 and the centers of the first openings 56A of the card holder 56 from each other, as shown in FIG. 6B. In this case, when the stage 53 moves upward, a large stress occurs between the first positioning pins 55A and the first openings 56A. In the worst case, this stress may damage the clamp mechanism 55, card holder 56, or the like.

Figure 6B:
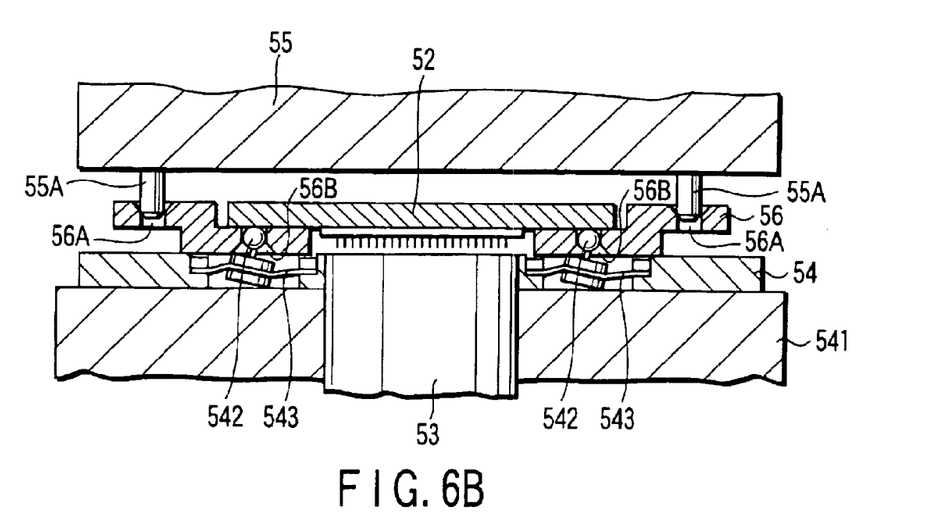
FIG. 6B is a sectional view showing a state wherein the card holder of the probe card and the clamp mechanism are connected to each other.

(e) As shown in FIG. 6B, the stage 53 moves upward, and the taper surfaces of the first openings 56A of the card holder 56 come into contact with the lower ends of the first positioning pins 55A. When the stage 53 moves further upward, a stress occurs between the first positioning pins 55A and the first openings 56A. This stress shifts the position of the probe card 52. Since the second positioning pins 542 of the support 541 can tilt to the right or left, thus, the positions of the first openings 56A can be set to coincide with the positions of the top of the first positioning pins 55A. As the top of the first positioning pins 55A and the first openings 56A fit with each other smoothly, the card holder 56 can be connected to the clamp mechanism 55.

(f) The clamp mechanism 55 fixes the card holder 56.

(g) When the probe card 52 is mounted on the clamp mechanism 55, the stage 53 moves downward. The operation of mounting the probe card 52 on the clamp mechanism 55 is thus completed.

The probe card 52 can be demounted from the clamp mechanism 55 by operations (h) to (m) that are reverse to the above operations (a) to (g).

(h) After moving the stage 53 to the position under the first predetermined position L1 in the prober chamber, the stage 53 moves upward toward the clamp mechanism 55, and the support 541 becomes close to the probe card 52.

(j) The second positioning pins 542 of the support 541 fit in the second openings 56B of the card holder 56. At that time, even if the positions of the second openings 56B and the positions of the second positioning pins 542 do not coincide, the tops 542A of the second positioning pins 542 enter the second openings 56B. As the support 541 moves upward, the second positioning pins 542 swingably supported by the leaf springs 543 incline. As shown in FIG. 6B, the second positioning pins 542 can fit in the second openings 56B, and the support 54 can be connected with the card holder 56.

(k) The clamp mechanism 55 releases the probe card 52, and the probe card 52 is placed on the support 541.

(l) The stage 53 moves to the transfer position L2, and the transfer mechanism 7 receives the probe card 52 from the support 541.

(m) The transfer mechanism transports the probe card 52 to outside the prober chamber.

The support moving mechanism shown in FIG. 1 can also employ the support 541 shown in FIG. 4. In this case as well, the probe card 52 can be mounted on the clamp mechanism 55, or demounted from the clamp mechanism 55. In this case, the reduced-diameter portions 541B of the openings 541A of the support carrying mechanism 54 and/or the reduced-diameter portions 545A of the retaining rings 545 can limit the tilting angle of the second positioning pins 542. As a result, the leaf springs 543 elastically deform, and the durability of the second positioning pins 542 and leaf springs 543 can be improved. The support 541 shown in FIG. 5 can simplify the structures of the second positioning pins 542 and leaf springs 543.

As described above, according to this embodiment, even if the positions of the first openings 56A of the card holder 56 do not coincide with the positions of the first positioning pins 55A of the clamp mechanism 55, as the first positioning pins 55A fit in the first openings 56A, the position of the probe card 52 moves on the support 541. In this movement, the second positioning pins 542 swingably supported by the leaf springs 543 gradually tilt. Because of this tilt, the probe card 52 can be reliably mounted on the clamp mechanism 55. This can prevent the support 541, the clamp mechanism 55, and the like from being damaged.

As the tops 542A of the second positioning pins 542 is spherical or partly spherical, the tops 542A of the second positioning pins 542 can smoothly slide in the second openings 56B. As a result, the tops 542A of the second positioning pins 542 do not receive any extra stress in the second openings 56B, and the second positioning pins 542 can tilt smoothly.

When demounting the probe card 52 from the clamp mechanism 55, even if the positions of the second positioning pins 542 and the positions of the second openings 56B do not coincide, the tops 542A of the second positioning pins 542 swingably supported by the leaf springs 543 can smoothly fit in the second openings 56B. As a result, the probe card 52 can be smoothly demounted from the clamp mechanism 55 without damaging the support 541 or card holder 56.

The support carrying mechanism 54 according to the invention of the present application can be widely employed as a to-be-connected body carrying mechanism 54 in a general technical field where a to-be-connected body 56 needs to be carried to a predetermined position of a connecting body 55, other than the clamp mechanism 55 and probe card 52. The general to-be-connected body carrying mechanism 54 may comprise a second positioning opening 56B, a support 541 configured to place the to-be-connected body thereon, a positioning fitting tool 542 provided to the support 541 by means of a swingable support mechanism 54, and a support moving mechanism 58 configured to move the support in the X, Y, Z, and θ directions. The above explanations using FIGS. 1 to 6 clearly explain the to-be-connected body carrying mechanism 54. Therefore, those skilled in the art can correctly understand the to-be-connected body carrying mechanism from the explanations, and can easily practice it.

According to this embodiment, when the means for limiting the tilting angle of the second positioning pins 542 (e.g., the reduced-diameter portions 541B of the openings 541A of the support 541 and/or the reduced-diameter portions 545A of the retaining rings 545) are provided to the openings 541A of the support 541, the second positioning pins 542 can be prevented from tilting more than necessary. Then, the leaf springs 543 can deform within the range of elastic deformation, and the durability of the second positioning pins 542, the leaf springs 543, and the like can be increased.

The present invention is not limited to the above embodiments, but the respective constituent elements can be changed in design when necessary. For example, the numbers of the first and second positioning pins can be 2 or more. These positioning pins can have different sizes, and can reliably set the probe card in a predetermined direction. The means for swingably supporting the second positioning pin is not limited to the leaf spring. This means can be any means that can swingably support the second positioning pin. The slit to be formed in the leaf spring is not limited to an arcuate slit. Any slit (e.g., straight slit) that can swingably support the positioning pin can be employed. The support according to the present invention can be applied not only to the probe card transporting apparatus, but can also be applied to any general case wherein a connecting body and a to-be-connected body are to be connected to each other.

According to the embodiments of the present invention, even if a card holder (connecting body) of a probe card and a clamp mechanism (to-be-connected body) that are to be connected to each other do not coincide with each other in position, an excessive stress in the connecting portion can be avoided or reduced. As a result, a probe card transporting apparatus and a support moving mechanism that can smoothly and reliably connect the card holder and clamp mechanism to each other can be provided.

Additional advantages and modifications will readily be conceived to those skilled in the art. Therefore, the invention in its broader aspects is not limited to the specific details and representative embodiments disclosed herein. Accordingly, various modifications may be made without departing from the spirit and scope of the general inventive concept as defined by the appended claims and their equivalents.

What is claimed is:

1. A probe card transporting apparatus configured to transport a probe card with a card holder between a first predetermined position L1 set in a prober chamber and a second predetermined position set outside the prober chamber, the probe card transporting apparatus comprising:

a first positioning fitting tool arranged at the first predetermined position in the prober chamber;

a transfer mechanism configured to carry the probe card with the card holder between a transfer position set in the prober chamber and the second predetermined position outside the prober chamber and to transfer the probe card with the card holder at the respective predetermined positions, the card holder including a first positioning to-be-connected tool and a second positioning to-be-connected tool; and a support carrying mechanism configured to carry the probe card with the card holder between the transfer position in the prober chamber and the first predetermined position in the prober chamber, the support carrying mechanism including:

a support configured to place thereon and support the probe card with the card holder;

a second positioning fitting tool attached to the support through a swingable support mechanism; and a support moving mechanism configured to move the support in X, Y, Z, and θ directions, the support moving mechanism serving to carry the probe card with the card holder between the transfer position and the first predetermined position in the prober chamber, wherein the probe card with the card holder which is carried by the support moving mechanism is positioned at the first predetermined position in the probe chamber when the first positioning to-be-fitted tool of the probe card with the card holder fits with the first positioning fitting tool.

2. A probe card transporting apparatus according to claim 1, wherein:

the first positioning fitting tool and the second positioning fitting tool comprise a first positioning pin and a second positioning pin, respectively;

the first positioning to-be-fitted tool and the second positioning to-be-fitted tool comprise a first opening and a second opening, respectively;

a top of the second positioning pin is substantially spherical at least partly; and the second positioning pin is attached to the support through the swingable support mechanism.

3. A probe card transporting apparatus according to claim 2, wherein the swingable support mechanism comprises a leaf spring.

4. A probe card transporting apparatus according to claim 3, wherein the swingable support mechanism further comprises means for limiting a tilting angle of the second positioning pin.

5. A probe card transporting apparatus according to claim 3, wherein the leaf spring of the swingable support mechanism comprises a plurality of slits.

6. A probe card transporting apparatus according to claim 5, wherein said plurality of slits comprise a plurality of arcuate slits arranged substantially concentrically and having different diameters.

7. A to-be-connected body carrying mechanism configured to carry a to-be-connected body to a predetermined position set on a connecting body, the to-be-connected body carrying mechanism comprising:

a positioning to-be-fitted tool provided to the to-be-connected body;

a support configured to place thereon and hold the to-be-connected body;

a positioning fitting tool attached to the support through a swingable support mechanism, wherein the positioning fitting tool serving to fit with the positioning to-be-fitted tool of the to-be-connected body, so that the to-be-connected body is positioned on the support; and a support moving mechanism configured to move the support in X, Y, Z, and θ directions.

8. A to-be-connected body carrying mechanism according to claim 7, wherein the positioning fitting tool comprises a positioning pin;

a top of the positioning pin is substantially spherical at least partly; and the positioning to-be-fitted tool comprises an opening.

9. A to-be-connected body carrying mechanism according to claim 7, wherein the swingable support mechanism comprises a leaf spring.

10. A to-be-connected body carrying mechanism according to claim 9, wherein the swingable support mechanism comprises means for limiting a tilting angle of the positioning pin.

11. A to-be-connected body carrying mechanism according to claim 9, wherein the leaf spring comprises a plurality of slits.

12. A to-be-connected body carrying mechanism according to claim 11, wherein said plurality of slits comprise arcuate slits arranged substantially concentrically and having different diameters.

* * * * *